United States Patent
Mehrad et al.

(10) Patent No.: US 6,451,642 B1
(45) Date of Patent: Sep. 17, 2002

(54) METHOD TO IMPLANT NMOS POLYCRYSTALLINE SILICON IN EMBEDDED FLASH MEMORY APPLICATIONS

(75) Inventors: Freidoon Mehrad; Jie Xia, both of Plano; Thomas M. Ambrose, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 09/599,377

(22) Filed: Jun. 22, 2000

Related U.S. Application Data

(60) Provisional application No. 60/143,796, filed on Jul. 14, 1999.

(51) Int. Cl.$^7$ .......................................... H01L 21/8238
(52) U.S. Cl. ...................... 438/201; 438/211; 438/275; 438/524; 438/738
(58) Field of Search ................................ 438/199–201, 438/211, 257–258, 275, 279, 514, 517, 524, 532, 700, 738, 533, 587, 924, 229–233; 216/62

(56) References Cited

U.S. PATENT DOCUMENTS

| | | | | |
|---|---|---|---|---|
| 5,665,203 A | * | 9/1997 | Lee et al. | 438/585 |
| 5,908,311 A | * | 6/1999 | Chi et al. | 438/258 |
| 6,033,944 A | * | 3/2000 | Shida | 438/199 |
| 6,071,779 A | * | 6/2000 | Mehrad et al. | 438/262 |
| 6,103,603 A | * | 8/2000 | Han | 438/532 |
| 6,265,292 B1 | * | 7/2001 | Parat et al. | 438/434 |
| 6,322,714 B1 | * | 11/2001 | Nallan et al. | 134/1.2 |

* cited by examiner

Primary Examiner—Stephen D. Meier
Assistant Examiner—Jamie L. Brophy
(74) Attorney, Agent, or Firm—Peter K. McLarty; W. James Brady, III; Frederick J. Telecky, Jr.

(57) ABSTRACT

A method to implant NMOS polycrystalline silicon in embedded FLASH memory applications is described. In the method the polycrystalline silicon region (130) that will used to form the gate electrode of the NMOS transistor is doped simultaneously along with the source line in the FLASH memory array.

6 Claims, 3 Drawing Sheets

METHOD TO IMPLANT NMOS POLYCRYSTALLINE SILICON IN EMBEDDED FLASH MEMORY APPLICATIONS

This application claims the benefit of provisional application Ser. No. 60/143,796 filed Jul. 14, 1999.

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 60/068,543 | 12/23/97 | TI-23167 |
| 60/117,774 | 1/29/99 | TI-28594 |
| * | * | TI- |

FIELD OF THE INVENTION

This invention relates generally to the field of electronic devices and more particularly to a method for forming a embedded FLASH memory circuit with reduced processing steps.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. This decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

Embedding FLASH memory circuits in CMOS logic circuits (embedded FLASH) is finding increasing usage in building more complex integrated circuits such as digital signal processors for applications such as hard disk controllers. Traditionally, in CMOS integrated circuit fabrication, the polysilicon gates of both the NMOS and PMOS transistors were doped n-type with phosphorous through diffusion or ion implantation with no additional photolithography masks. The shrinking dimensions of the transistors in current use in CMOS integrated circuits have led to the gate of the NMOS transistors being doped n-type with this dopant being blocked from entering the gates of the PMOS transistors using a photolithographic pattern and masking step. The gates of the PMOS transistors are implanted p-type during the formation of the source and drain regions of the PMOS transistors. This process results in the proper threshold voltage in both the NMOS and PMOS transistors.

In the FLASH memory array, a continuous source line is often used to increase circuit packing density. This continuous source line is formed using a self-aligned source (SAS) process. Here, the isolation regions between the source regions of adjacent FLASH memory cell transistors are removed using a photolithography and etch process. Photolithography is used to form a patterned resist film and the exposed oxide isolation is removed using a oxide etch process. A continuous source line is then formed using ion implantation of n-type dopant species with the photoresist acting as an implant mask.

In the fabrication of embedded FLASH circuits, the CMOS transistors are masked during the SAS process and then processed separately after the formation of the FLASH memory cells and the continuous source line. This is mainly due to the inability to simultaneously etch doped and undoped polysilicon to form CMOS transistor gate structures. This masking and separate processing of the CMOS and FLASH portions of an embedded integrated circuit results in a complex process requiring many photolithographic masking levels which add tremendous cost to the process.

SUMMARY OF THE INVENTION

Accordingly, a need has arisen for a simplified process to form embedded FLASH integrated circuits. The present invention provides method that accomplishes this through a reduction in number of masking levels and improved etching processes. The method comprises: forming a photoresist film on a semiconductor substrate; patterning said photoresist film to expose a source line region in a FLASH memory array and a polycrystalline silicon film region in a CMOS circuit wherein said polycrystalline silicon film region will be used to form a gate electrode of a NMOS transistor; and simultaneously implanting said exposed source line region and said exposed polycrystalline silicon film region with a dopant ion species.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1A through 1G illustrates a simplified process for forming embedded FLASH integrated circuits according to an embodiment of the instant invention.

Figure 1A:
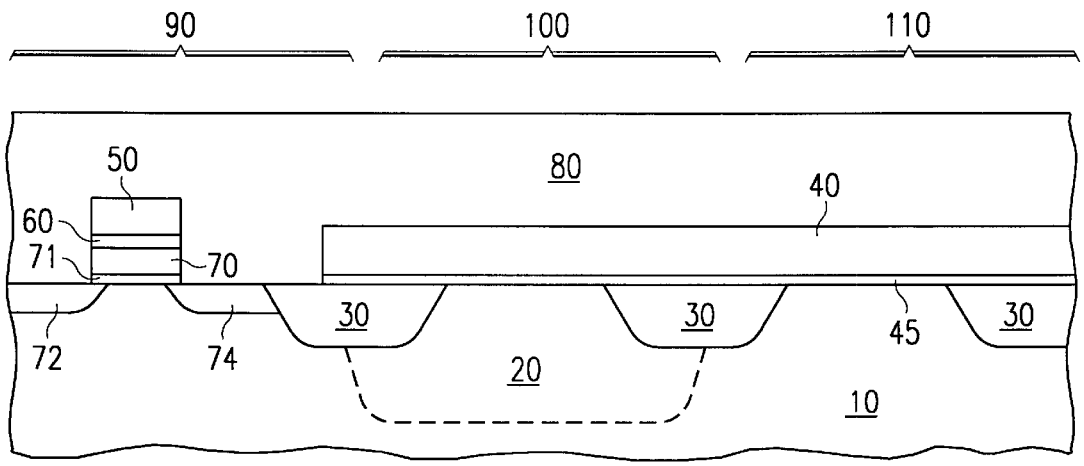
FIGS. 1A–1G are cross-sectional views of an embedded FLASH integrated circuit comprising a FLASH memory cell, a PMOS transistor and a NMOS transistor illustrating the steps on an embodiment of the instant invention.

Illustrated in FIG. 1A is a portion of an embedded FLASH integrated circuit. A memory cell will be formed in region 90, a PMOS transistor in region 100, and a NMOS transistor in region 110. The substrate comprises p-type silicon 10 with regions of n-type silicon 20 in which the PMOS transistors will be formed. Both regions 10 and 20 comprise single crystal silicon either as part of a bulk substrate wafer or as an epitaxial silicon film formed on a bulk substrate wafer. Isolation regions 30 are formed in the substrate to electrically isolate the various devices which are formed as part of the integrated circuit. These isolation regions comprise silicon dioxide and will be either shallow trench isolation (STI) structures or local oxidation structures (LOCOS). The isolation structures shown in FIGS. 1A–1G are representative of STI structures. A gate dielectric film 45 is formed over the semiconductor substrate 10 which will form part of the NMOS and PMOS transistor structure. This gate dielectric can comprise silicon oxide, silicon oxynitride, silicon nitride, or any suitable material. The FLASH memory cell shown in 90 comprises a n-type drain region 72 and a n-type source region 74. The FLASH memory cell also comprises a gate dielectric film 71, a floating gate 70, a interpoly dielectric layer 60, and a control gate 50. This gate dielectric 71 can comprise silicon oxide, silicon oxynitride, silicon nitride, or any suitable material The floating gate 70 and the control gate 50 may be formed using polycrystalline silicon with the control gate being n-type. The interpoly dielectric layer 60 may be formed using alternating layers of silicon dioxide (oxide) and silicon nitride (nitride) usually in the form of an oxide-nitride-oxide stacked layer. At this point in the process, the individual gates of the PMOS and NMOS transistors have not been formed and a blanket layer of polycrystalline silicon 40 covers regions 100 and 110. A layer of photoresist 80 has been formed on the substrate which will be used for the SAS process.

Figure 1B:
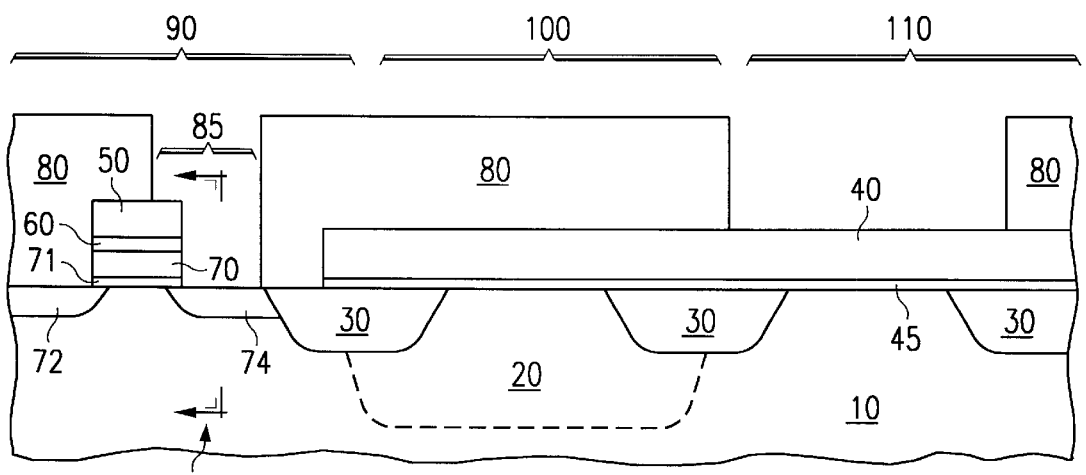
Figure 1C:
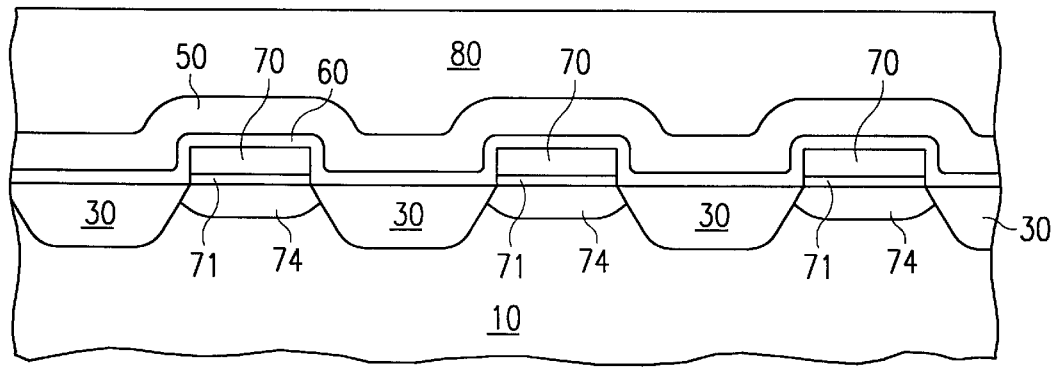

Illustrated in FIG. 1B is the structure of FIG. 1A after the patterning of the photoresist layer 80 to expose the area where the source line will be formed 85, and at the same time exposing the polycrystalline silicon in region 110 where the NMOS transistor will be formed. This is in contrast to previous processes where the polycrystalline silicon which will be used to form the gate of the NMOS transistor is not exposed at this point. In this case additional processes will have to performed to form the NMOS and PMOS gate electrodes as well as implant n-type dopant ions into the gate of the NMOS transistor. These addition processes add complexity and cost to the overall embedded FLASH process. Shown in FIG. 1C is a cross-section of the structure shown in FIG. 1B in the direction illustrated by 115. This shows the continuous word line 50, and the isolation structures 30 that will be removed to form the self aligned source (SAS) region.

Figure 1D:
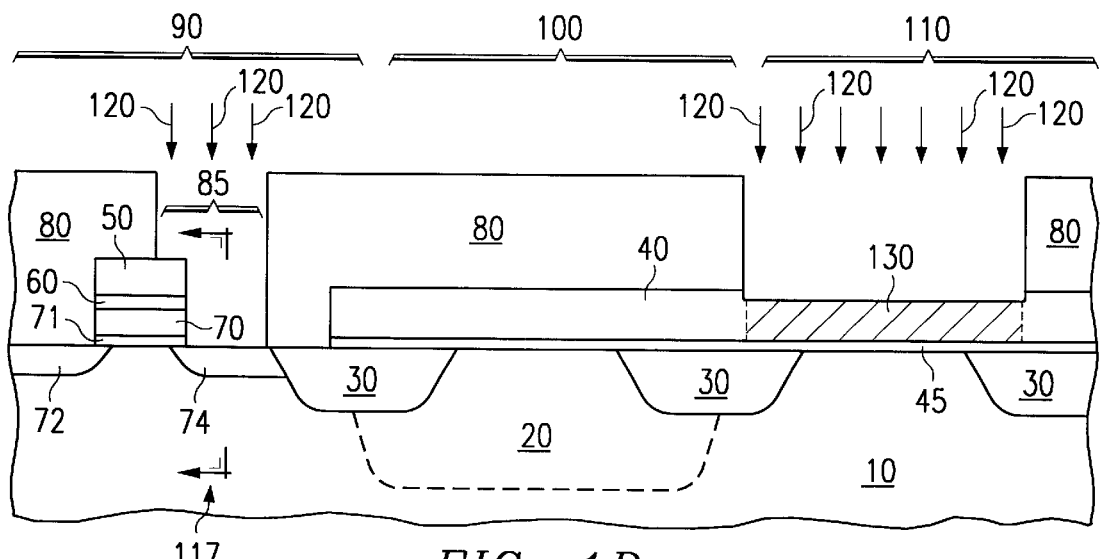
Figure 1E:
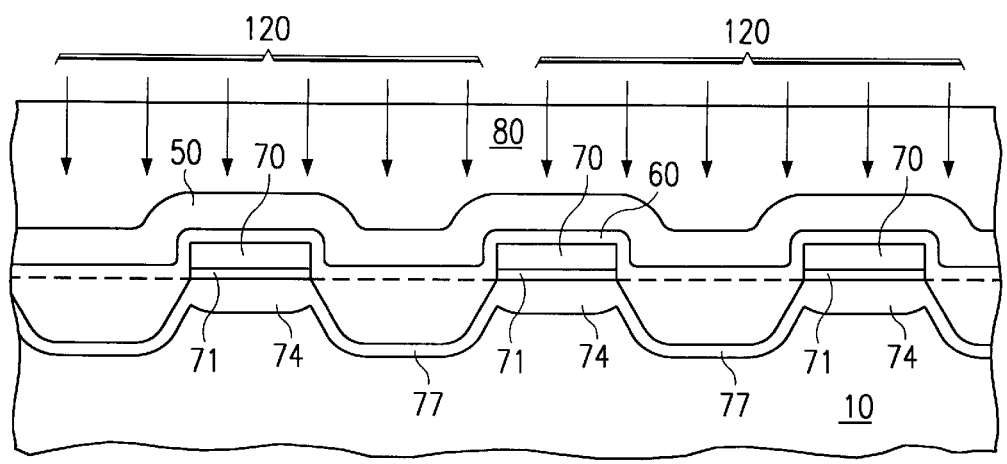

Shown in FIG. 1D is the structure of FIG. 1B after the isolation oxide etch and n-type dopant implant. The isolation oxide etch will remove all the isolation oxide exposed in region 85 that forms a continuous line with the source region 74 and extends both into and out of the plane of FIG. 1D. The is illustrated in FIG. 1E which shows a cross-section in the plane 117 illustrated in FIG. 1D. As shown in FIG. 1E, the isolation material in the trenches 30 has been removed during the SAS etch process exposing the silicon substrate 10. As shown in FIG. 1D, the implanted n-type dopant implant species 120 will result in the simultaneous formation of the source line in the FLASH memory array and the n-type region 130 of the polycrystalline silicon film 40 which will be used to form the gate electrode of the NMOS transistor. This n-type dopant species 120 may comprise phosphorous ions or arsenic ions or a combination of both. As shown in FIG. 1E, the implantation of the n-type dopant species results in the formation of the continuous source line 77. As shown in FIG. 1D, the portion of the polycrystalline film in region 100 was masked from the implant by the photoresist layer 80 and will be used to form the gate of the PMOS transistor. This process will result in a reduction in the number of masking steps when compared to conventional processes where the source line formation and the doping of the polycrystalline silicon region 130 used to form the NMOS gate electrode are performed in separate steps. During the isolation oxide etch, the thickness of the polycrystalline film in region 130 will be reduced by about 50 A to 200 A depending on the etch process used. After the implantation of the n-type dopant species 120 and any additional processes, the resist film 80 is removed and a new photoresist layer 140 is formed and patterned to mask the FLASH memory cell and expose the areas of the polycrystalline film 40 which will be etched away to form the gate electrodes of the NMOS and PMOS transistors.

Figure 1F:
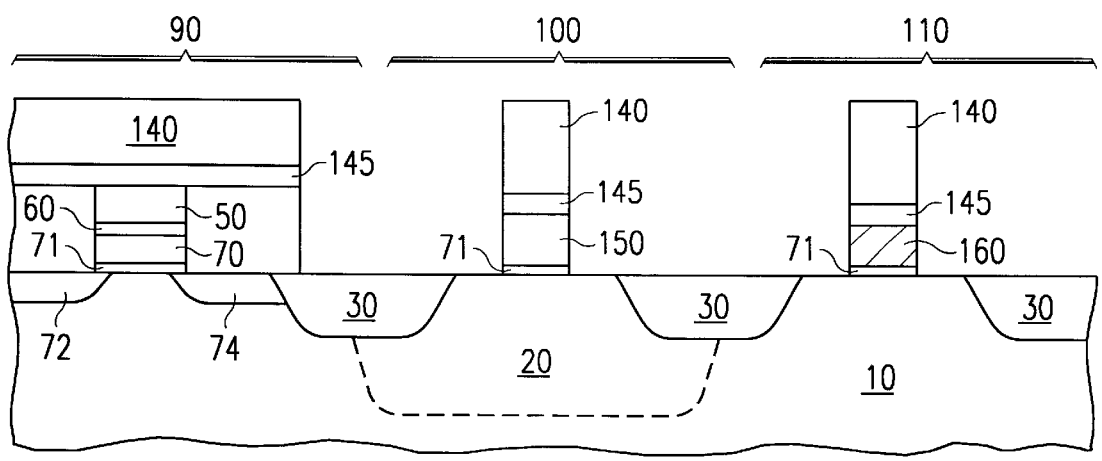

Illustrated in FIG. 1F is the structure after the polycrystalline silicon etch process showing the NMOS transistor gate electrode 160 and the PMOS transistor gate electrode 150. The etch process used to form the gate electrodes 150 and 160 should possess the property of being able to form lines 0.07 um to 0.5 um in width in both doped and undoped polycrystalline silicon simultaneously. The ability of the polysilicon etch process to etch both doped and undoped polysilicon to ultra fine linewidths is an advantage of the instant invention. A suitable etch process for forming the gate electrodes 150 and 160 (ie., simultaneously etching doped an undoped polysilicon) in an embodiment of the instant invention will now be described. In this embodiment the resist layer 140 comprises a 6000 A–8000 A deep ultraviolet (DUV) photoresist film and overlies a 1300 A–1700 A deep ultraviolet (DUV) anti-reflective coating (BARC) 145. Following the isolation oxide etch process, the doped polycrystalline film will be about 2500 A thick and the undoped polycrystalline film will be about 2600 A thick. The gate dielectric layer 45 under the polycrystalline layer will be about 38 A thick. The process will be performed in an etch chamber with a De-coupled Plasma Source and comprises an in-situ BARC and polycrystalline etch process with the following steps:

a) BARC Etch

HBr 85–100 sccm

O2 15–20 sccm

Pressure 4–8 mTorr

Source power 300–320 Watt

Bias power 110–170 Watt

Cathode Temp 55 C

Wall/Dome Temp 80/80 C

Etch Time Endpoint (3090 A wavelength) with 35% over-etch time b) Poly Breakthrough Etch CF4 30–60 sccm Pressure 3–7 mTorr Source power 400–800 Watt Bias power 25–60 Watt Cathode Temp 55 C Wall/Dome Temp 80/80 C Etch Time 10 s c) Poly Main Etch (Bulk step)

HBr 110–140 sccm

Cl2 30–60 sccm

HeO2 12–19 sccm

Pressure 3–7 mTorr

Source power 500–600 Watt
Bias power 25–60 Watt
Cathode Temp 55 C
Wall/Dome Temp 80/80 C
Etch Time 50 s
d) Poly Endpoint Etch
HBr 130–170 sccm
Cl2 60–80 sccm
HeO2 15–20 sccm
Pressure 8–15 mTorr
Source power 300–450 Watt
Bias power 50 Watt
Cathode Temp 55 C
Wall/Dome Temp 80/80 C
Etch Time Endpoint (2880 A wavelength)
e) Poly Over Etch
HBr 130–170 sccm
HeO2 9–13 sccm
Pressure 90–120 mTorr
Source power 700–900 Watt
Bias power 100–250 Watt
Cathode Temp 55 C
Wall/Dome Temp 80/80 C
Etch Time 65 s The BARC etch is designed to have smaller etch biases. The Poly etch is designed to have less doped and undoped differences to increase margins for the n-type polycrystalline region 103 recess (~100 A) due to SAS isolation etch process.

Figure 1G:
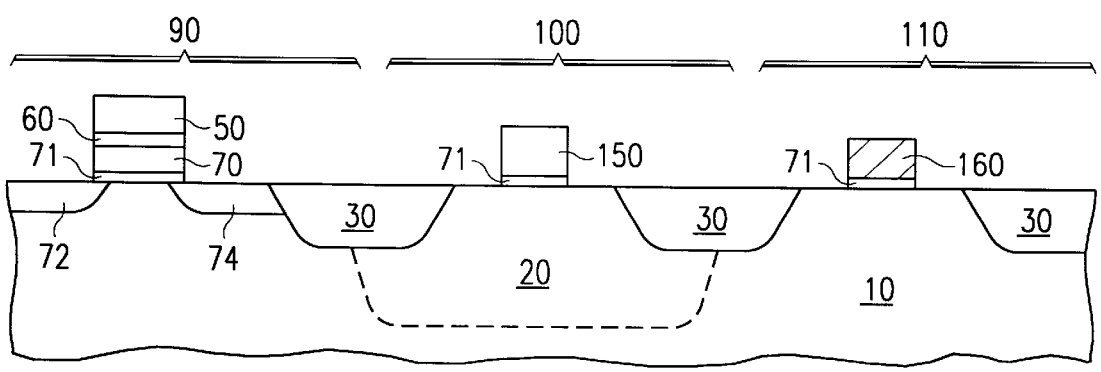

Illustrated in FIG. 1G is the structure of FIG. 1F after removal of the resist film 140 and the BARC film 145. The embedded FLASH integrated circuit will be completed using standard semiconductor processing.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating an embedded FLASH integrated circuit comprising:

forming a photoresist film on a semiconductor substrate;

patterning said photoresist film to expose a source line region in a FLASH memory array and a polycrystalline silicon film region in a CMOS circuit wherein said polycrystalline silicon film region will be used to form a gate electrode of a NMOS transistor; and simultaneously implanting said exposed source line region and said exposed polycrystalline silicon film region with a dopant ion species.

2. The method of claim 1 wherein said dopant ion species is selected from the group consisting of phosphorous and arsenic.

3. The method of claim 1 further comprising the step of patterning and etching said polycrystalline silicon film region to form at least one gate electrode for a NMOS transistor and at least one gate electrode for a PMOS transistor.

4. The method of claim 3 wherein said patterning and etching said polycrystalline silicon film comprises:

forming a anti-reflective coating film on said polycrystalline silicon film;

forming a photoresist film on said anti-reflective film;

patterning and removing portions of said photoresist film to expose both doped and undoped regions of said polycrystalline silicon film;

etching said anti-reflective coating film; and simultaneously etching said doped and undoped regions of said polycrystalline silicon film.

5. A method of patterning and simultaneously etching doped and undoped polycrystalline silicon comprising:

providing a film of polycrystalline silicon comprising doped and undoped regions;

forming a anti-reflective coating film on said polycrystalline silicon film;

forming a photoresist film on said anti-reflective film;

patterning and removing portions of said photoresist film to expose both doped and undoped regions of said polycrystalline silicon film;

etching said anti-reflective coating film comprising:
flowing HBr in a plasma etcher at 85–100 sccm;
flowing O2 in a plasma etcher at 15–20 sccm;
maintaining a plasma etcher chamber pressure of 4–8 mTorr;
maintaining a plasma etcher source power of 300–320 Watt;
maintaining a plasma etcher bias power of 110–170 Watt; and simultaneously etching said doped and undoped regions of said polycrystalline silicon film.

6. A method of patterning and simultaneously etching doped and undoped polycrystalline silicon comprising:

providing a film of polycrystalline silicon comprising doped and undoped regions;

forming a anti-reflective coating film on said polycrystalline silicon film;

forming a photoresist film on said anti-reflective film;

patterning and removing portions of said photoresist film to expose both doped and undoped regions of said polycrystalline silicon film;

etching said anti-reflective coating film; and simultaneously etching said doped and undoped regions of said polycrystalline silicon film comprising:
flowing HBr in a plasma etcher at 110–140 sccm;
flowing Cl2 in a plasma etcher at 30–60 sccm;
flowing HeO2 in a plasma etcher at 12–19 sccm;
maintaining a plasma etcher chamber pressure of 3–7 mTorr;
maintaining a plasma etcher source power of 500–600 Watt;
maintaining a plasma etcher bias power of 25–60 Watt.

* * * * *